United States Patent
Dobyns et al.

(10) Patent No.: US 8,675,719 B2
(45) Date of Patent: Mar. 18, 2014

(54) MULTI-DOMAIN TEST AND MEASUREMENT INSTRUMENT

(75) Inventors: Kenneth P. Dobyns, Beaverton, OR (US); Marcus K. Da Silva, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 491 days.

(21) Appl. No.: 12/892,758

(22) Filed: Sep. 28, 2010

(65) Prior Publication Data

US 2012/0076187 A1 Mar. 29, 2012

(51) Int. Cl.
*H04B 17/00* (2006.01)

(52) U.S. Cl.
USPC .......................................... 375/224

(58) Field of Classification Search
USPC ................ 375/224, 272; 370/208, 334
See application file for complete search history.

(56) References Cited

U.S. PATENT DOCUMENTS

| | | |
|---|---|---|
| 6,681,191 B1 | 1/2004 | Pickerd |
| 2002/0147554 A1 | 10/2002 | Pickerd |
| 2005/0261847 A1 | 11/2005 | Nara |
| 2007/0171811 A1 * | 7/2007 | Lee et al. ............... 370/208 |
| 2012/0230445 A1 * | 9/2012 | Kato et al. .............. 375/267 |

FOREIGN PATENT DOCUMENTS

| | | |
|---|---|---|
| EP | 0945731 A1 | 9/1999 |
| EP | 0973041 A1 | 1/2000 |
| EP | 1669764 A1 | 6/2006 |
| EP | 2096451 A1 | 9/2009 |
| EP | 2113777 A1 | 11/2009 |

OTHER PUBLICATIONS

European Patent Office Search Report dated 12 Jan. 2012, 8 pages.

* cited by examiner

*Primary Examiner* — Khai Tran
(74) *Attorney, Agent, or Firm* — Marger Johnson & McCollum PC; Thomas F. Lenihan

(57) ABSTRACT

A test and measurement instrument including a time domain channel configured to process a first input signal for analysis in a time domain; a frequency domain channel configured to process a second input signal for analysis in a frequency domain; and an acquisition system coupled to the time domain channel and the frequency domain channel. The acquisition system is configured to acquire data from the time domain channel and the frequency domain channel. Time domain and frequency domain data can be time aligned.

15 Claims, 5 Drawing Sheets

MULTI-DOMAIN TEST AND MEASUREMENT INSTRUMENT

BACKGROUND

This disclosure relates to test and measurement instruments, in particular to test and measurement instruments with inputs optimized for both time domain and frequency domain analysis.

Electronic devices can operate with signals that can be represented in multiple domains. That is, an electronic device can have signals that are customarily defined mathematically in the time domain, such as digital control signals, data, and transmitter/receiver control signals, and signals that are most often defined in the frequency domain, such as modulated RF and/or optical carriers.

For example, a frequency-hopping spread-spectrum based device can change its carrier frequency according to a pseudorandom number. This pseudorandom number can be encoded in a control signal of a transmitting device. Since the pseudorandom number changes over time, the control signal encoding the pseudo random number is typically analyzed in the time domain. However, the resulting changes to the carrier are changes in frequency that are typically analyzed in the frequency domain.

Accordingly, signals can exist within a device or system that must be analyzed in both the time domain and the frequency domain. As described above, aspects of such signals can be linked together, such as the pseudorandom number and the carrier frequency. However, test and measurement instruments are typically designed for analysis in only one domain. For example, an oscilloscope can measure signals in the time domain and a spectrum analyzer can measure signals in the frequency domain. Such measuring instruments are not time-aligned. Thus, analysis of multi-domain devices described above is difficult.

Some test and measurement instruments have some multi-domain analysis capability. For example, an oscilloscope can provide a discrete Fourier transform (DFT) function to display a frequency spectrum of an input signal. However, a DFT of a digitized time domain signal is limited by the nature of a DFT. That is, to obtain a small frequency step, i.e. a fine resolution in the frequency domain, a long time span is necessary in the time domain. Similarly, to acquire data for a wide frequency span, a high sample rate is needed. Thus, fine resolution of a modulated carrier at a higher frequency requires both a high sample rate and a long time span, requiring a large acquisition memory, which is expensive or unavailable in an oscilloscope.

Furthermore, time alignment of signals in the time domain and signals in the frequency domain can be affected by sample rate and acquisition time. For example, a higher time precision in the time domain requires a higher sample rate. However, with a given fixed memory size, the higher sample rate limits the time span and thus the size of a frequency step in the frequency domain. In other words, the frequency domain analysis precision is limited by the time domain analysis precision Since test and measurement instruments with such multi-domain capability typically have acquisition parameters such as sample rate and record length for multiple channels linked together, simultaneous analysis in both the time domain and the frequency domain can be difficult. That is, precision in one domain can be mutually exclusive with precision in the other.

SUMMARY

An embodiment includes a test and measurement instrument including a time domain channel configured to process a first input signal for analysis in a time domain; a frequency domain channel configured to process a second input signal for analysis in a frequency domain; and an acquisition system coupled to the time domain channel and the frequency domain channel. The acquisition system is configured to acquire data from the time domain channel and the frequency domain channel substantially simultaneously.

An embodiment includes frequency shifting a first signal; digitizing the frequency shifted first signal; storing the digitized frequency shifted first signal in a memory; digitizing a second signal; and storing the digitized second signal in the memory.

An embodiment includes a test and measurement instrument including a time domain channel configured to process a first input signal for analysis in a time domain; a frequency domain channel configured to process a second input signal for analysis in a frequency domain; and a controller coupled to the time domain channel and the frequency domain channel and configured to control acquisition parameters of the time domain channel and the frequency domain channel such that the acquisition parameters of the time domain channel and the frequency domain channel are different.

DETAILED DESCRIPTION

Embodiments include test and measurement instruments and techniques where signals can be analyzed in multiple domains. For example, control signals which determine when events happen can be analyzed in the time domain. These control signals often control a frequency event, such as a change in a carrier frequency. In an embodiment, acquisition of signals to analyze the two events can be optimized for time domain analysis, for frequency domain analysis, and for time aligned analysis between the domains.

Figure 1:
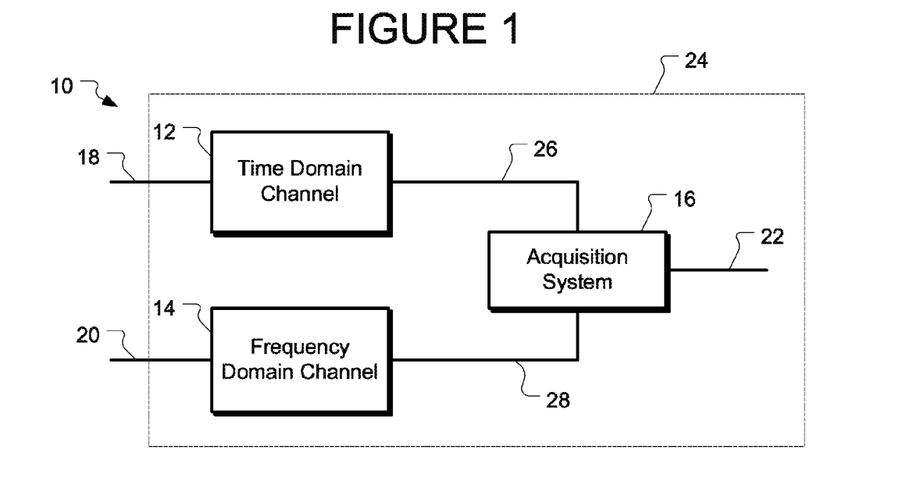
FIG. 1 is a block diagram of a test and measurement instrument having a time domain channel and a frequency domain channel according to an embodiment.

FIG. 1 is a block diagram of a test and measurement instrument having a time domain channel and a frequency domain channel according to an embodiment. In this embodiment, the instrument 10 includes a time domain channel 12 configured to receive a first input signal 18, and a frequency domain channel 14 configured to receive a second input signal 20. An acquisition system 16 is coupled to the time domain channel 12 and the frequency domain channel 14, and is configured to acquire data from the time domain channel and the frequency domain channel.

The time domain channel 12 can be configured to sample the first input signal 18 for analysis in the time domain. For example, the time domain channel 12 can include digitizers such as multi-bit analog to digital converters, comparators for sensing discrete levels, or the like. The time domain channel 12 can include other circuitry, such as amplifiers, input protection, or other conditioning circuitry. The time domain channel 12 can include other digital processing circuitry, such as memories, decimators, or the like. Accordingly, the output signal 26 can be the digitized version of the input signal 18 in the time domain.

In an embodiment, the time domain channel 12 can include circuitry that is optimized for acquisition of a signal for analysis in the time domain. For example, a signal suited to time domain analysis can be a control signal, a data signal, or the like. Such signals can have frequency components from DC to a maximum frequency, such as 1 GHz, 26.5 GHz, or the like. Accordingly, the time domain channel 12 can include amplifiers, attenuators, and other circuitry that cover the entire bandwidth from DC to the maximum frequency.

The frequency domain channel 14 can be configured to process the second input signal 20 differently than the time domain channel 12. In particular, the frequency domain channel 14 can be configured to process the second input signal 20 for analysis in the frequency domain. For example, as will be described in further detail below, the second input signal 20 can be frequency shifted to a different frequency range. In particular, the second input signal 20 can be downconverted to a lower frequency range. That is, the input signal 20 has been frequency shifted. In an embodiment, this frequency shifted signal can be the output signal 28.

This frequency shifting is an example of a difference in processing of an input signal by the time domain channel 12 and the frequency domain channel 14. In addition, in an embodiment, the frequency domain channel 14 can include attenuators, filters, amplifiers, or the like that can be optimized for those signals that require frequency-domain representation and analysis. For example, an amplifier in the frequency domain channel 14 can be configured to have a lower noise figure and a lower maximum input level than an amplifier in the time domain channel 12. In another example, the amplifier can have a different frequency range. That is, an amplifier in the time domain channel 12 can have a frequency range of DC to 26.5 GHz. The amplifier can be optimized for amplifying signals throughout the frequency range. However, when analyzing a high frequency signal in the frequency domain and, in particular, when analyzing a signal that was downconverted in the frequency domain components that do not operate across an entire frequency range from DC to a maximum frequency can be used. For example, if a signal of interest has a frequency range centered at 15 GHz, an amplifier with a frequency range from 10 GHz to 20 GHz can be used. Such an amplifier can have better performance over its frequency range than an amplifier spanning the larger frequency range from DC to 26.5 GHz.

Similarly, the frequency domain channel 14 can include other components that have different bandwidths, input ranges, noise figures, or the like that would otherwise be used in the time domain channel 12. That is, amplifiers, mixers, local oscillators, attenuators, filters, switches, or the like in the frequency domain channel 14 can be selected to have features that would degrade and/or eliminate the full bandwidth of a time domain channel 14.

Accordingly, due to the frequency shifting described above, effects of the different components described above, or the like from the frequency domain channel 14, the output signal 28 can be a signal that is processed more appropriately for frequency domain analysis than if processed in a time domain channel 12. Furthermore, as will be described in further detail below, the input signal 20 has been processed according to frequency domain related acquisition parameters that can be not only appropriate to the frequency range, resolution bandwidth, or the like that is of interest, but may be also be different from the acquisition parameters of the time domain channel 12. That is, not only can the frequency domain channel 14 have different components than the time domain channel 12, but the frequency domain channel 14 and the time domain channel 12 can be operated differently, for example, by having different sample rates, record lengths, or the like. Thus, each of the frequency domain channel 14 and the time domain channel 12 can be optimized for corresponding analysis of the acquired signals in the frequency domain and time domain, respectively.

The acquisition system 16 can include a variety of circuitry. For example, the acquisition system can include digitizers, decimators, filters, memories, or the like. The acquisition system 16 can be coupled to the time domain channel and the frequency domain channel and configured to acquire data from the time domain channel and the frequency domain channel. For example, the time domain channel 12 can be configured to filter, scale, or otherwise condition the output signal 26 to be in an appropriate range for a digitizer of the acquisition system. Similarly the frequency domain channel 14 can also be configured to condition the signal for a digitizer of the acquisition system 16, albeit differently than the time domain channel 12 as described above.

Figure 2:
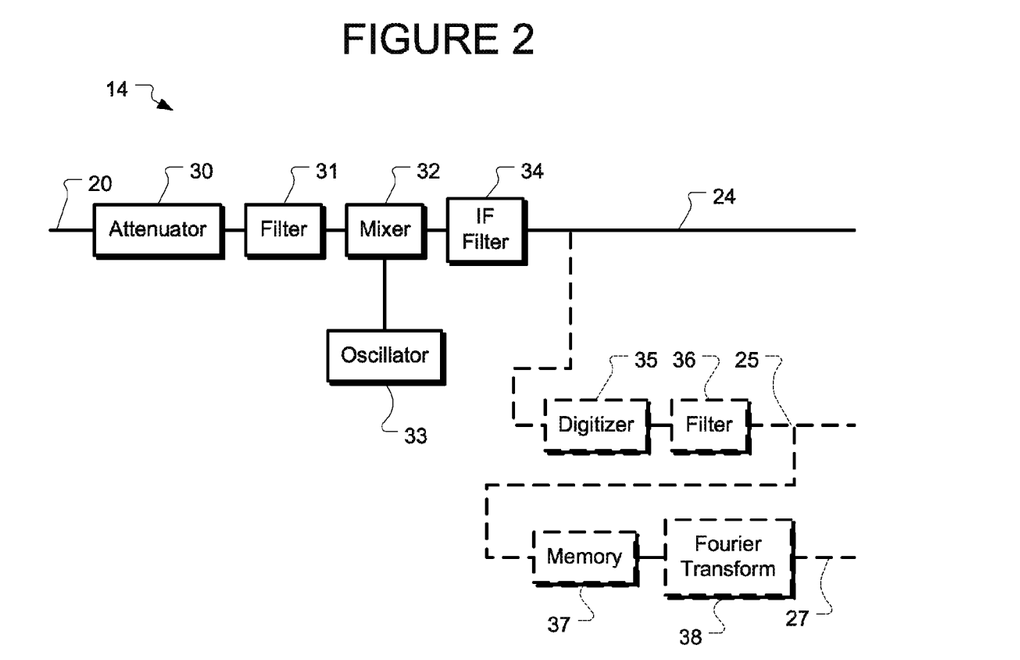
FIG. 2 is a block diagram of an example of frequency domain channel in the test and measurement instrument of FIG. 1.

FIG. 2 is a block diagram of an example of frequency domain channel in the test and measurement instrument of FIG. 1. In this example, the frequency domain channel 14 includes an attenuator 30, a filter 31, a mixer 32, a local oscillator 33, and an IF filter 34. The input signal 20 is received by the attenuator 30. The attenuator 30 can be a fixed attenuator, variable attenuator, switched attenuator, or the like. The attenuated signal is filtered by filter 31. In an embodiment, the filter 31 can be selected as desired for the appropriate input frequency range. For example, the filter 31 can be a low-pass filter, a band-pass filter, a high pass filter, or the like depending on the particular frequency range of interest, the oscillator 33 frequency, or the like.

The filtered signal can be downconverted to an IF range using the mixer 32 and local oscillator 33. An IF filter 34 can filter the IF signal before it is available as an output signal 24. In this embodiment, the output signal 24 can be the frequency domain channel 14 output signal 28 of FIG. 1, available to be acquired by the acquisition system 16.

In an embodiment, the output signal 24 represents the input signal 20 after downconversion to the IF frequency range. This IF signal can be further processed or acquired in the acquisition system 16 as illustrated in FIG. 1. For example, as will be described in further detail below, the IF signal can be converted in to in-phase (I) and quadrature phase (Q) signals, transformed using a Fourier transform, or the like.

In another embodiment, the frequency domain channel 14 can include a digitizer 35, and a digital filter 36. The digitizer 35 can be configured to digitize the output IF signal 24. The digital filter 36 can be applied to reduce artifacts, provide a windowing function, or the like to the digitized IF signal. Accordingly, a digitized IF signal 25 can be available as the frequency domain channel 14 output signal 28 of FIG. 1, to be acquired by the acquisition system 16.

In yet another embodiment, the frequency domain channel 14 can include a memory 37 and a processor configured to perform a Fourier transform 38 such as a fast Fourier transform (FFT), discrete Fourier transform (DFT), chirp-Z transform, or the like on a segment of the digitized IF signal 25. At this point the digitized IF signal 25 can be transformed, changing its mathematical representation from a function of time to a function of frequency, represented by transformed signal 27. Although a Fourier transform 38 has been given as an example, other transforms, such as a Laplace transform, a Hilbert transform, or the like can be substituted as desired. Regardless, the transformed IF signal 27 can be available as the frequency domain channel 14 output signal 28 of FIG. 1, to be acquired by the acquisition system 16.

Accordingly, the frequency domain channel 14 output signal 28 can take a variety of forms suitable to allow analysis of the input signal 20 in the frequency domain. The various components, processing, and the like can be divided between the frequency domain channel 14 and the acquisition system 16 as desired. However, regardless of form, the output signal 28 can be processed by components that can be selected and/or tuned for the frequency range of interest. Regardless of the form of the frequency domain channel 14 output signal 28, the acquired data 22 including data from the time domain channel 12 and the frequency domain channel 14 can be available for further processing, display, analysis in the respective domain, or the like.

In an embodiment, the acquisition system 16 can be configured to acquire substantially time aligned versions of the output signal 26 and the output signal 28. For example, the output signals 26 and 28 can be stored in an acquisition memory of the acquisition system 16. As will be described in further detail below, the acquisitions of the output signals 26 and 28 can be performed in response to the same trigger. Accordingly, as the output signal 26 can be acquired with the time domain channel 12 optimized for time domain analysis and the output signal 28 can be acquired with the frequency domain channel 12 optimized for frequency domain analysis, substantially time aligned time and frequency domain analyses can be performed without sacrificing the optimization of acquisition for one analysis domain over another.

Although a selection of components of the frequency domain channel 14 has been illustrated, other components, such as amplifiers, switches, decimators, limiters, or the like can be present and/or replace illustrated components.

Referring back to FIG. 1, in an embodiment, the time domain channel 12, the frequency domain channel 14, and the acquisition system 16 can be substantially encapsulated in a housing 24. For example, the instrument 10 can include a case. The time domain channel 12 can include an input connector on a front panel, such as a BNC connector, a multi-channel connector, or the like. The frequency domain channel 14 can have a connector suitable for higher frequencies, such as an SMA, N, 2.92 mm, or other high performance connector. That is, the frequency domain channel 14 can include a connector that is optimized higher frequency performance.

The housing 24 can include a common display, keys, knobs, dials, or other user interfaces. Although common aspects of the user interface can control different aspects of time domain and frequency domain signals, different interfaces can be provided to access the different functions. For example, one button may cause a common knob to control the time base. Another button may cause the common knob to control the center frequency.

In an embodiment, the time domain channel 12 and the frequency domain channel 14 can have different operational frequency ranges. The time domain channel 12 can have a first operational frequency range. For example, the time domain channel 12 can be DC coupled. That is, the time domain channel 12 can be used to acquire DC signals and/or baseband signals with frequency components down to DC. In addition, the time domain channel 12 can have a relatively low upper frequency limit. For example, a time domain channel 12 can have a 1 GHz bandwidth. Thus, the time domain channel 12 can be configured to have an input frequency range from DC to 1 GHz.

However, the frequency domain channel 14 can be configured to have a different input frequency range. For example, as illustrated in the example of FIG. 2, the frequency domain channel 14 can be configured to downconvert the input signal 20 to a lower IF frequency range. Thus, the operational input frequency range of the frequency domain channel 14 can be configured to be different from the time domain channel 12. For example, the input frequency range of the frequency domain channel could be up to 26.5 GHz. That is, the various filters 31, 34, 36, or the like, can affect the operational input bandwidth.

Furthermore, the components selected for the frequency domain channel 14 can be selected to optimize the associated frequency ranges, rather than then entire input frequency range. For example, the components can be selected for an optimum sensitivity, dynamic range, noise level, or the like for a particular frequency range. In contrast, in an embodiment, the time domain channel 12 can be optimized for its entire frequency range. That is, the time domain channel 12 can be configured to expect a signal anywhere within its entire bandwidth. However, the frequency domain channel 14 can be configured to select a particular frequency range of interest. Moreover, the frequency domain channel 14 can be configured to acquire signals outside of the bandwidth of the time domain channel. Accordingly, the frequency domain channel 14 can be optimized for that frequency range.

Figure 3:
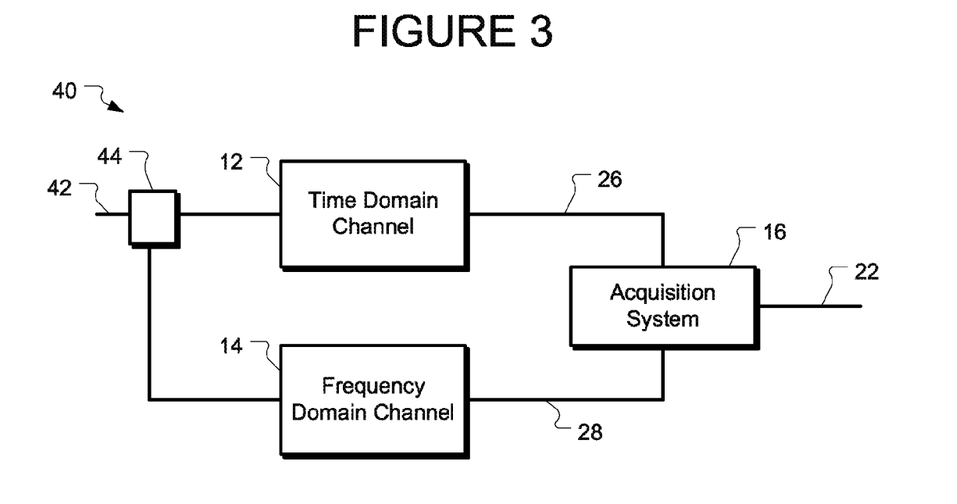
FIG. 3 is a block diagram of a test and measurement instrument having a time domain channel and a frequency domain channel coupled to a single input according to an embodiment

FIG. 3 is a block diagram of a test and measurement instrument having a time domain channel and a frequency domain channel coupled to a single input according to an embodiment. In this embodiment, the time domain channel 12 and the frequency domain channel 14 can each be configured to receive the same input signal 42. For example, a splitter, switch, selector, or other signal routing device 44 can be used to route the input signal 42. Accordingly, in one configuration, only the time domain channel 12 receives the input signal 42. In another configuration, only the frequency domain channel 14 receives the input signal 42. In yet another configuration, both the time domain channel 12 and the frequency domain channel 14 can receive the input signal 42.

In an embodiment, each of the time domain channel 12 and the frequency domain channel 14 can have its own digitizer. Accordingly, the output signal 26 and 28 can be digital signals that have been digitized in a channel optimized for analysis in a respective time domain and frequency domain. In another embodiment, as described above, digitizers can be part of the acquisition system 16. Still, the output signals 26 and 28 can be analog signals that have been processed such that they are optimized for acquisition and analysis in the respective domains.

Figure 4:
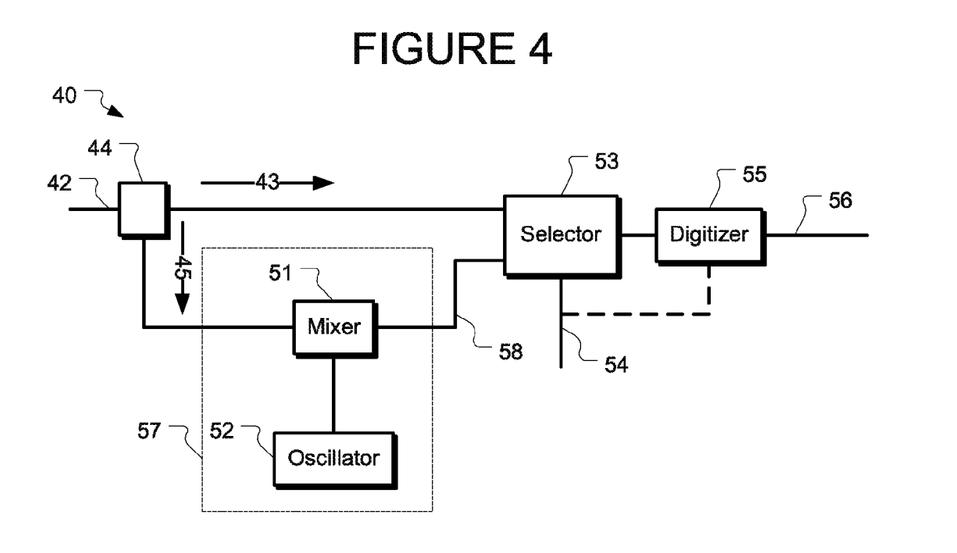
FIG. 4 is a block diagram of an example of the test and measurement instrument of FIG. 3.

FIG. 4 is a block diagram of an example of the test and measurement instrument of FIG. 3. In this embodiment, the instrument 50 includes a common input 44 configured to receive an input signal 42, a downconverter 57, a selector 53, and a digitizer 55. The downconverter 57 can include a mixer 51 and a local oscillator 52. Other components, such as filters, amplifiers, attenuators, or the like are not illustrated for clarity. The downconverter 57 can output a downconverted version 58 of the input signal 42.

Both the input signal 42 and the downconverted signal 58 are available to the selector 53. Accordingly, on a single input 44, circuitry that can be optimized for analysis in the frequency domain, such as the downconverter 57 and/or other associated amplifiers filters, or the like, can be added to a single channel. However, common circuitry, such as the digitizer 55 can be used for both directly digitizing the input signal 42 as well as the downconverted signal 58 to be used in time domain and frequency domain analysis.

For example, the digitizer 55 can be capable of digitizing at a 1 GS/s sample rate. Accordingly, the time domain path 43 can have a corresponding maximum input frequency, such as 500 MHz. In contrast, the frequency domain path 45 can include components that allow for a substantially higher maximum frequency range. For example, the downconverter 57 can be configured to downconvert signals having frequencies up to 26.5 GHz. However, the IF bandwidth of the downconverted signal 58 can be 500 MHz. Thus, the same digitizer 55 and other common circuitry can still be used to digitize both baseband digital signals and downconverted signals.

As will be described in further detail below, the digitizer 55 can be configured to operate at a different sample rate when performing frequency domain analysis than when performing time domain analysis. For example, in response to the selection signal 54, the digitizer 55 can be configured to select a sample rate appropriate to the incoming signal. That is, in an embodiment, a high sample rate can be used for acquisition of a signal for time domain analysis; however, a lower sample rate appropriate to the downconverted signal 58 can be used for acquisition of a signal for frequency domain analysis.

Thus, the same input can be configurable to provide both a signal 26 optimized for time domain analysis and a signal 28 optimized frequency domain analysis. As illustrated in FIG. 3, the same input signal can be acquired and analyzed substantially simultaneously in the time domain and the frequency domain. However, as illustrated in the embodiment of FIG. 4, the signal path for the acquired signal can be selected from one optimized for time domain analysis and another optimized for frequency domain analysis.

Figure 5:
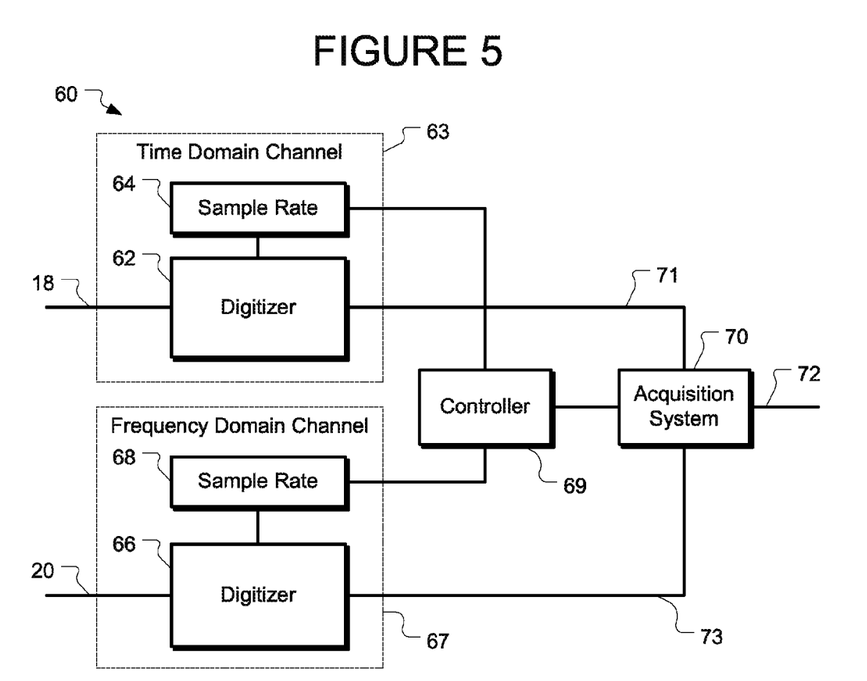
FIG. 5 is a block diagram of a test and measurement instrument having different acquisition parameters for multiple channels according to an embodiment.

FIG. 5 is a block diagram of a test and measurement instrument having different acquisition parameters for multiple channels according to an embodiment. In this embodiment, the instrument 60 includes a time domain channel 63 and a frequency domain channel 67, each of which is coupled to an acquisition system 70 similar to FIG. 1 described above. A controller 69 is coupled to the time domain channel 63 and the frequency domain channel 67. The controller 14 can be any variety of circuitry. For example, the controller 14 can include analog and digital circuitry. The controller 14 can include general purpose processors, digital signal processors, application specific integrated circuits, programmable gate arrays, or the like. The controller 14 can also include appropriate circuitry to interface with the time domain channel 63, the frequency domain channel 67, and the acquisition system 70.

The controller 69 can be configured to control the acquisition parameters of the time domain channel 63 and the frequency domain channel 67. In particular, the controller 69 can be configured to control the acquisition parameters such that the acquisition parameters can be different. In this example, the controller 69 can be configured to control the sample rates 64 and 68 of the respective digitizers 62 and 66. The sample rate 64 and the sample rate 68 are configurable such that the sample rate 64 and the sample rate 68 can be different. Accordingly, the digitized time domain data 71 and the digitized frequency domain data 73 can have different lengths.

The independence of the sample clocks allows for independent control of time domain and frequency domain parameters. For example, to acquire a time domain signal, the sample rate can be selected to exceed the highest frequency component of interest in the time domain signal by a factor of two. If the time domain signal has frequency components at 1 GHz, a sample rate of 2 GS/s or above can be used. If the frequency domain channel is locked to the same sample rate, then, when using a DFT, the frequency step size or an associated resolution bandwidth of the frequency domain data 73 directly drives the number of samples, or the time span. As a result, the resolution bandwidth is limited by the available acquisition memory size. Alternately, the sample rate of the time domain channel 63 will be limited in order to realize a narrow resolution bandwidth on the frequency domain channel 67.

In contrast, if the sample rates can be different, a sample rate appropriate to the desired aspects of the frequency domain data 73 can be selected. For example, if the input signal 20 is downconverted as described herein, a lower sample rate corresponding to the desired frequency span can be used. That is, if the carrier was at 1 GHz and the modulation occupied 20 MHz, the downconverted signal could occupy 20 MHz plus and additional margin for filtering, sampling, or the like. Assuming that such a sample rate is 50 MS/s, $1/40^{th}$ of the acquisition memory would be needed for the same time span and hence, the same frequency step size.

The above scenarios are merely examples that illustrate where different sample rates can be used. Regardless of the specific application, the different sample rates allow the selection to be made particular to the given channel, input signal, and domain of interest.

The sample rates described above for the time domain channel 63 and the frequency domain channel 67 can be different, but not necessarily independent. For example, the different sample rates can be phase locked to a common, lower frequency clock. However, independence here can mean independently controllable. Moreover, although separate sample rates 64 and 68 have been described, the associated oscillators, clocks, or the like can be substantially synchronized with a common circuit for the instrument 60.

Furthermore, although a sample rate has been used as an example of an acquisition parameter that could be different between the time domain channel 63 and the frequency domain channel 67, other acquisition parameters can be controlled by the controller 69 to be different. For example, the controller 69 can be configured to control the acquisition system 70 such that the acquisition periods, record lengths, or the like associated with the time domain channel 63 and frequency domain channel 67 are different. In another example, the controller 69 can be configured to adjust components in the respective channels, such as filter bandwidths, filter center frequencies, attenuator settings, or the like. As a result, the acquisition parameters for the time domain channel 63 and frequency domain channel 67 can each be controlled to optimize the channel for the acquisition of the associated input signal such that the associated input signal is optimized for analysis in different domains.

Figure 6:
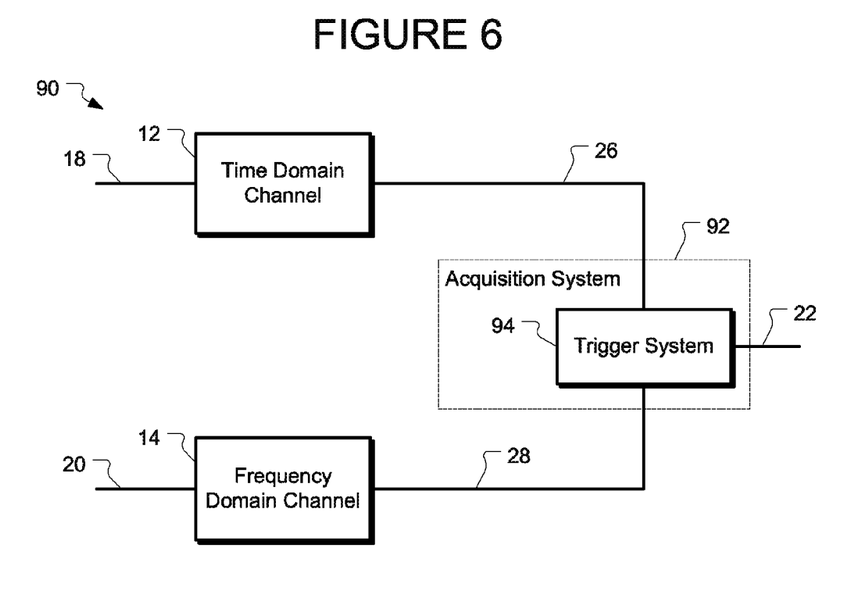
FIG. 6 is a block diagram of a test and measurement instrument having trigger system that can trigger an acquisition from a time domain channel and/or a frequency domain channel according to an embodiment.

FIG. 6 is a block diagram of a test and measurement instrument having trigger system that can trigger an acquisition from a time domain channel and/or a frequency domain channel according to an embodiment. In this embodiment, the instrument 90 includes an acquisition system 92. The acquisition system 92 can include a triggering system 94. The triggering system can be coupled to the time domain channel 12 and the frequency domain channel 14. Accordingly, an acquisition of the acquisition system 92 can be triggered in response to time domain signals, frequency domain signals, a combination of such signals, or the like.

As the same event or combination of events can be used to trigger acquisitions in both the frequency and time domains, the acquired signals can be time aligned to a higher degree. For example, the acquired data can be as time aligned as two input channels of an oscilloscope, i.e. substantially aligned on a per sample basis. Thus, when examining an event in one domain, the corresponding, substantially contemporaneous signals in another domain can be analyzed. As used herein, substantially contemporaneous and/or time aligned can include a time accuracy that is limited by a lowest sample rate of time aligned channels.

Furthermore, the common triggering can result in cross-domain triggering. For example, the acquisition system 92 can be configured to identify an event in the time domain signal 18. In response an acquisition of the frequency domain signal 20 can be triggered. In this example, the time domain signal 18 need not have been acquired. For example, a signal turning a transmitter on, i.e. a time domain control signal, can be used to trigger an acquisition of the transmitted signal. The transmitted signal can be analyzed in the frequency domain.

Similarly, a frequency domain event can be used to trigger a time domain acquisition. For example, a received RF signal can be monitored until the frequency range changes to a particular frequency range, such as one of the ranges associated with a frequency-hopping signal. An acquisition of the demodulated data in the receiver can be acquired for analysis in response to the appearance of the RF signal in the frequency range of interest.

Although an event in one domain has been described as used to trigger an acquisition for analysis in another domain, the same event could be used to trigger an acquisition for analysis in any or all domains. Furthermore, events from different domains can be combined together. For example, a frequency domain glitch or other spurious signal can be combined with a control signal indicating that the signal of interest should be within the frequency span with the glitch. That is, signals associated with a receiver can be acquired in response to both a frequency domain anomaly and a control signal of the receiver indicating that it is expecting a signal in the associated frequency range. Although particular examples of signals, characteristics of signals, combination of events, or the like have been described above, any events from any signals can be used and/or combined as desired to trigger an acquisition.

Figure 7:
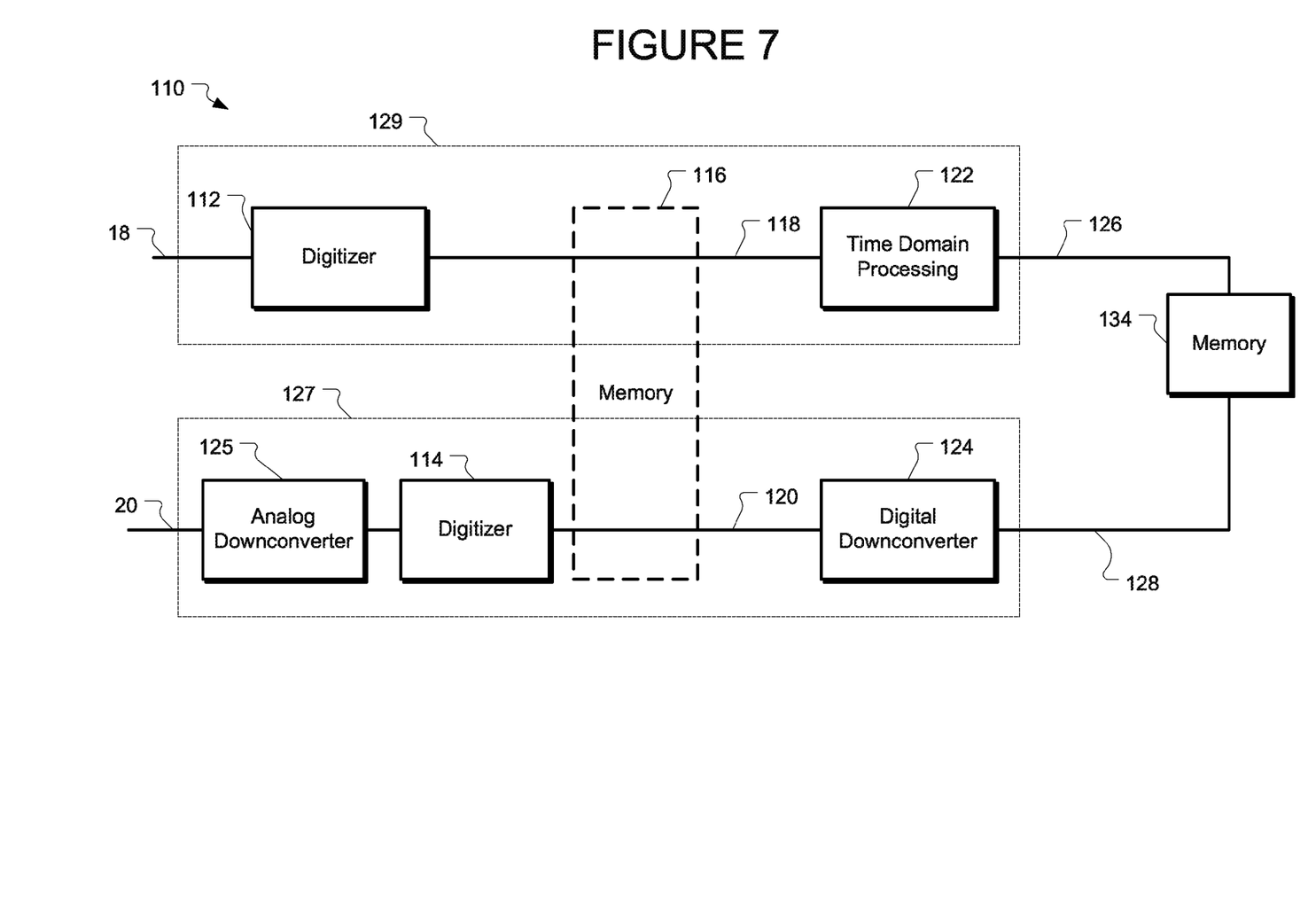
FIG. 7 is a block diagram of a test and measurement instrument having a time domain channel and a frequency domain channel according to another embodiment.

FIG. 7 is a block diagram of a test and measurement instrument having a time domain channel and a frequency domain channel according to another embodiment. In this embodiment, the instrument 110 includes a time domain channel 129 and a frequency domain channel 127. Each includes respective digitizers 112 and 114. The frequency domain channel includes an analog downconverter 125 configured to receive the input signal 20. The digitizer 114 is configured to digitize the downconverted signal from the analog downconverter 127.

In an embodiment, the digitized signals from the digitizer 112 and 114 could be stored in a memory 116. Subsequent processing, as will be described below, could be performed as desired on the stored digitized signals in the memory 116.

Regardless of whether the digitized signals are stored in the memory 116, further processing can be performed. For example, the digitized signal 118 can be further processed by time domain processing 122. For example, signal conditioning, filtering, decimation or the like can be applied to the time domain signal 118. The resulting processed time domain signal 126 can be stored in the memory 134.

The frequency domain channel 127 also includes a digital downconverter 124. The digital downconverter 124 can be configured to convert the digitized downconverted signal 120 into an in-phase (I) and quadrature phase (Q) representation. This can be accomplished through an additional downconversion processes. Accordingly, the downconverted signal 128 can include both the in-phase and quadrature phase representations of the input signal 20. In another example, the I/Q signals can be converted into other signals, such as amplitude, phase, frequency, or the like. Furthermore, the I/Q signals can be demodulated to capture the underlying symbols, bits, or other data. In another example, a transformation such as an FFT can be applied. Any such processing can be performed to generate any of these signals or other signals to be stored in the memory 134.

Figure 8:
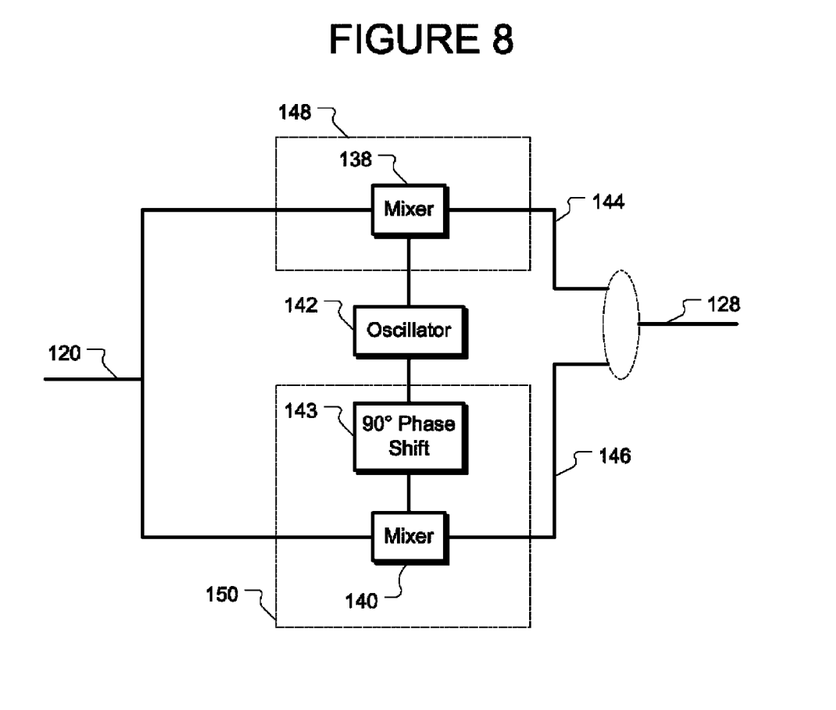
FIG. 8 is a block diagram of an example of the digital downconverter in the test and measurement instrument of FIG. 7.

FIG. 8 is a block diagram of an example of the digital downconverter in the test and measurement instrument of FIG. 7. In this embodiment, the digitized signal 120 is input to both an in-phase path 148 and a quadrature phase path 150. Each path is configured to receive a signal from a local oscillator 142; however, the quadrature phase path 150 is configured to receive a signal that is 90 degrees out of phase with the signal received by the in-phase path 148.

Each path 148 and 150 is configured to mix the input signal 120 with the corresponding signal from the local oscillator 142. Thus, in-phase signal 144 and quadrature phase signal 146 are created. Additional filtering and/or decimation can be applied to the signals 144 and 146 as desired. As described above with respect to FIG. 7, these signals can be stored in the memory 134, further processed, or the like. In particular, signals 144 and 146 can be a complex-number representation of the digitized signal 120. For example, in-phase signal 144 can represent a real part of the digitized signal 120 and quadrature phase signal 146 can represent the imaginary part of the digitized signal 120. Such a complex-number representation can be used to calculate various other representations of the digitized signal 120, such as phase, frequency, encoded data, or the like.

Although a DFT has been described above in connection with the frequency domain processing, any Fourier transform or other transforming functions can be used as desired.

Although various signals have been described above as downconverted in frequency, such signals can be upconverted as desired into an appropriate IF frequency range. For example, frequencies below an IF frequency range can be upconverted into the IF frequency range. Such upconversion and downconversion can collectively be referred to as frequency shifting Although particular embodiments have been described, it will be appreciated that the principles of the invention are not limited to those embodiments. Variations and modifications may be made without departing from the principles of the invention as set forth in the following claims.

The invention claimed is:

1. A test and measurement instrument, comprising:
   a time domain channel configured to process a first input signal for analysis in a time domain;
   a frequency domain channel configured to process a second input signal for analysis in a frequency domain; and
   an acquisition system coupled to the time domain channel and the frequency domain channel and configured to acquire data from the time domain channel and the frequency domain channel,
   wherein the time domain channel and the frequency domain channel are not used to process the same signal sequentially.

2. The test and measurement instrument of claim 1, further comprising:

a trigger system coupled to the time domain channel and the frequency domain channel, and configurable to trigger an acquisition of the acquisition system in response to at least one of an event from the time domain channel and an event from the frequency domain channel.

3. The test and measurement instrument of claim 1, wherein
the acquisition system is configured to time align an acquisition of the time domain channel with an acquisition of the frequency domain channel.

4. The test and measurement system of claim 1, further comprising:
a controller coupled to the time domain channel and the frequency domain channel and configured to control acquisition parameters of the time domain channel and the frequency domain channel such that the acquisition parameters of the time domain channel and the frequency domain channel are different.

5. The test and measurement system of claim 4, wherein:
the time domain channel is configured to sample at a first sample rate;
the frequency domain channel is configured to sample at a second sample rate; and
the controller is configured to set the first sample rate and the second sample rate to be different.

6. The test and measurement system of claim 1, further comprising:
an input port;
wherein the input port is configured to receive an input signal and provide the input signal to the time domain channel and the frequency domain channel.

7. The test and measurement system of claim 6, wherein the time domain channel and the frequency domain channel are configured to process the input signal contemporaneously.

8. The test and measurement system of claim 1, further comprising:
an acquisition memory;
wherein:
the frequency domain channel further comprises:
an in-phase path coupled to the acquisition memory; and
a quadrature-phase path coupled to the acquisition memory; and
the time domain channel is coupled to the acquisition memory.

9. The test and measurement system of claim 1, further comprising:
a housing;
wherein the time domain channel, the frequency domain channel, and the acquisition system are substantially encapsulated in the housing.

10. The test and measurement system of claim 1, wherein:
the time domain channel has a first frequency range;
the frequency domain channel has a second frequency range; and
the first frequency range is different from the second frequency range.

11. The test and measurement system of claim 1, further comprising:
an input port coupled to the frequency domain channel and the time domain channel;
a selector configured to receive an output of the frequency domain channel and an output of the time domain channel; and
a digitizer configured to digitize an output of the selector.

12. A test and measurement instrument, comprising:
a time domain channel configured to process a first input signal for analysis in a time domain;
a frequency domain channel configured to process a second input signal for analysis in a frequency domain; and
a controller coupled to the time domain channel and the frequency domain channel and configured to control acquisition parameters of the time domain channel and the frequency domain channel such that the acquisition parameters of the time domain channel and the frequency domain channel are different.

13. The test and measurement instrument of claim 12, wherein
the time domain channel is configured to sample at a first sample rate;
the frequency domain channel is configured to sample at a second sample rate; and
the controller is configured to set the first sample rate and the second sample rate to be different.

14. The test and measurement instrument of claim 12, further comprising:
an acquisition system coupled to the time domain channel and the frequency domain channel and configured to acquire data from the time domain channel and the frequency domain channel;
wherein:
the acquisition system is configured to acquire the data from the time domain channel over a first time period and acquire the data from the frequency domain channel over a second time period; and
the controller is configured to set the first time period and the second time period to be different.

15. The test and measurement instrument of claim 12, wherein
the time domain channel is configured to have a first bandwidth;
the frequency domain channel is configured to have a second bandwidth; and
the controller is configured to set the first bandwidth and the second bandwidth to be different.

* * * * *

UNITED STATES PATENT AND TRADEMARK OFFICE
CERTIFICATE OF CORRECTION

| | | |
|---|---|---|
| PATENT NO. | : 8,675,719 B2 | Page 1 of 1 |
| APPLICATION NO. | : 12/892758 | |
| DATED | : March 18, 2014 | |
| INVENTOR(S) | : Dobyns et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 637 days.

Signed and Sealed this
Seventh Day of July, 2015

Michelle K. Lee
*Director of the United States Patent and Trademark Office*